(12) United States Patent
Le Loc'h

(10) Patent No.: US 6,472,733 B1
(45) Date of Patent: Oct. 29, 2002

(54) ELECTRONIC CIRCUIT SUPPORT COMPRISING TEAR RESISTANT MEANS

(75) Inventor: Alain Le Loc'h, Versailles (FR)

(73) Assignee: Bull CP8, Louveciennes (FR)

( * ) Notice: Subject to any disclaimer, the term of this patent is extended or adjusted under 35 U.S.C. 154(b) by 0 days.

(21) Appl. No.: 09/462,787

(22) PCT Filed: May 10, 1999

(86) PCT No.: PCT/FR99/01106
§ 371 (c)(1),
(2), (4) Date: Jan. 13, 2000

(87) PCT Pub. No.: WO99/60518
PCT Pub. Date: Nov. 25, 1999

(30) Foreign Application Priority Data

May 20, 1998 (FR) .............................................. 98 06361

(51) Int. Cl.$^7$ .............................................. H01L 23/02
(52) U.S. Cl. ...................................... 257/679; 257/730
(58) Field of Search ................................ 257/679, 683, 257/730, 787

(56) References Cited

U.S. PATENT DOCUMENTS 5,031,026 A * 7/1991 Ueda ........................... 257/679
5,640,306 A * 6/1997 Gaumet et al. ............. 257/679
5,786,988 A * 7/1998 Harari ......................... 361/749
5,877,544 A * 3/1999 Rigal et al. ................. 257/679

FOREIGN PATENT DOCUMENTS

EP  0 716 394 A  6/1996
FR  2 724 750 A  3/1996

* cited by examiner

Primary Examiner—Roy Potter
(74) Attorney, Agent, or Firm—Edward J. Kondracki; Miles & Stockbridge P.C.

(57) ABSTRACT

The invention relates to a substrate for an electronic circuit (9), the electronic circuit carrying at least one contact pad, the substrate comprising an insulating element (3, 12) housing the electronic circuit and carrying, on an external side, a conductive layer defining at least one contact region (7, 8), said contact pad being connected to said contact region. The substrate comprises at least one fragile zone (5, 6) disposed in the insulating element (3, 12). The electronic circuit substrate may be constituted by a chip card wherein an external readable button contains the electronic circuit. The chip card may cooperate electrically with a card reader.

32 Claims, 4 Drawing Sheets

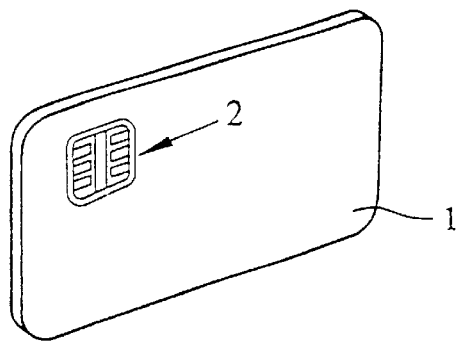
Fig. 1
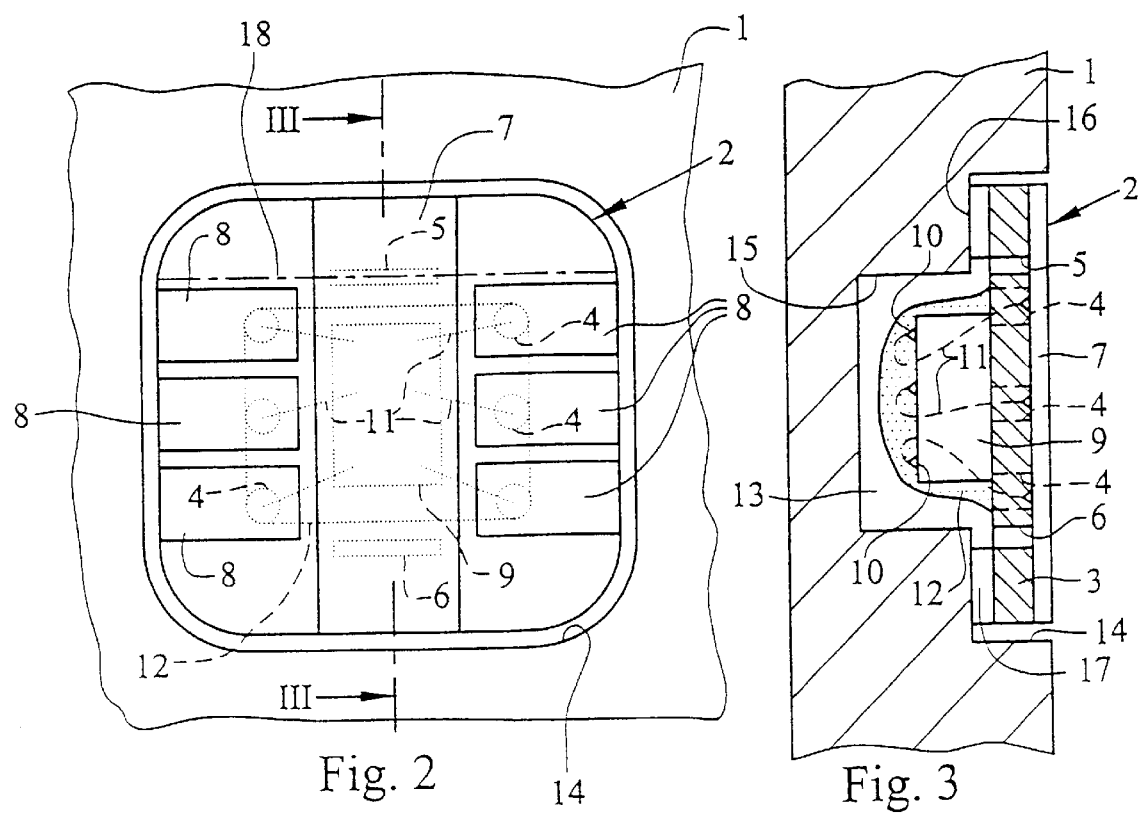
Fig. 2
Fig. 3

ELECTRONIC CIRCUIT SUPPORT COMPRISING TEAR RESISTANT MEANS

FIELD OF THE INVENTION

The invention relates to a substrate for an electronic circuit, the electronic circuit carrying at least one contact pad, the substrate comprising an insulating element housing the electronic circuit and carrying, on an external side, a conductive layer defining at least one contact region, said contact pad at least provided being connected to said contact region.

DESCRIPTION OF RELATED ART

A substrate of this type is well known in the field of chip cards of the credit card type or other types; described for example in the document U.S. Pat. No. 4,211,919, and used by a user to obtain products or services, or to access a location. In this case, several contact pads are provided, which enable the card to cooperate with a card reading terminal into which it is inserted. The substrate is inserted into a recess produced in the card, and is mounted to it, particularly by bonding.

A known means of fraud, for removing any information identifying the legitimate card holder affixed to the surface of the card (such as a number, an inscription or a photo), consists of removing the substrate from an authentic card and attaching it to a fraudulent card. To do this, it is necessary to detach the substrate without damaging it.

SUMMARY OF THE INVENTION

The object of the invention is to provide the means for making the fraudulent operation for removing the substrate detectable, or even inoperable.

According to the invention, the substrate is characterized in that it comprises at least one fragile zone disposed in the insulating element. Thus, during an attempt to remove the substrate in which stress is exerted on it, the substrate will be damaged due to the presence of the fragile zone; the fragile zone will cause deformations which can be seen in the conductive layer; these same deformations will often result in making the substrate inoperable, since they will have caused a break in the electronic circuit or in its connection with the contact region.

BRIEF DESCRIPTION OF THE DRAWINGS

Other details and advantages of the present invention will emerge from the following description of several preferred but non-limiting embodiments, with reference to the attached drawings, in which:

FIG. 1 is a perspective view of a substrate for an electronic circuit constituted by a chip card equipped with a button housing an electronic circuit;

FIG. 2 is a partial, enlarged top view of FIG. 1, showing the button according to the invention;

FIG. 3 is a cross-sectional view, along the line III—III of FIG. 2;

DESCRIPTION OF THE PREFERRED EMBODIMENT(S)

Figure 4:
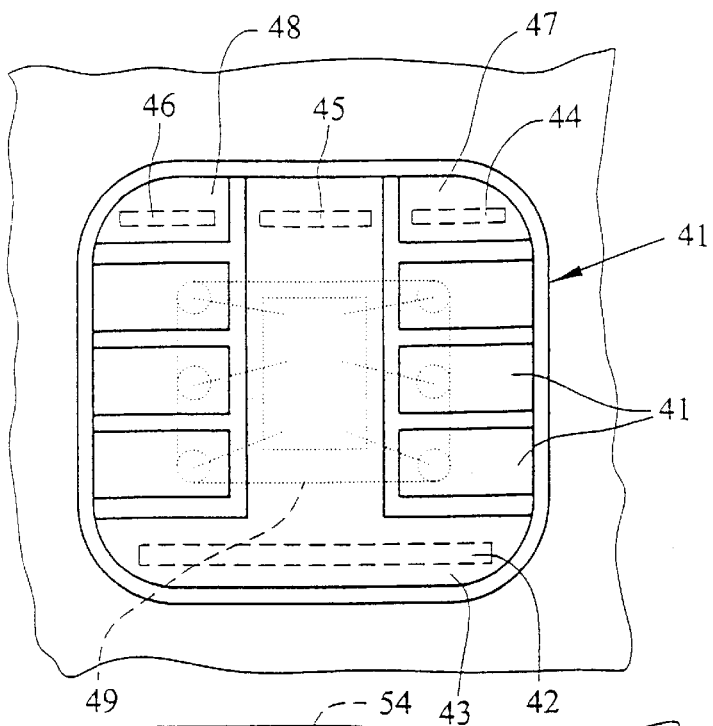
FIG. 4 is a top view of a button according to a variant of embodiment of the invention.

FIG. 1 represents an electronic circuit substrate constituted by a chip card 1. This chip card carries a button 2 containing an electronic circuit and is equipped to cooperate electrically with a card reader, which is intrinsically known and not represented.

The button 2 appears in detail in FIGS. 2 and 3. It comprises an electrically insulating layer 3 comprising several electrical connecting holes 4 and two fragile zones 5, 6, described in detail below. An external side of the insulating layer 3 carries a conductive layer, particularly made of copper, composed of several contact regions including a central contact region 7 which, in this example, runs along an entire length of the button, and six peripheral contact regions 8 distributed on both sides of the central contact region 7. An internal side of the insulating layer 3 carries an electronic circuit 9 bonded to it and typically comprising a memory and possibly processing means such as a microprocessor. The electronic circuit 9 carries, on a side facing away from the insulating layer 3, contact pads 10 (six, in this example), respectively connected to each of the six peripheral contact regions 8 by a connecting wire 11. Each connecting wire 11 passes through a corresponding electrical connecting hole 4 and is soldered to a pad and to the corresponding contact region 8 in a known way. Finally, an electrically insulating casing 12 covers the electronic circuit 9 and the electrical connecting holes 4 of the insulating layer 3, with the exception of the fragile zones 5, 6.

The electrical connecting holes 4 are disposed facing the contact regions 8. The fragile zones 5, 6 are constituted by grooves disposed facing the central contact region 7 and running in a straight line perpendicular to it. They are disposed on both sides of the electronic circuit 9. The electrical connecting holes 4 and the fragile zones 5, 6 pass through the entire thickness of the insulating layer 3; they are made either by perforating the insulating layer before the conductive layer is bonded to it, or by molding in the case of a molded insulating layer, or even by etching by means of a laser beam.

The insulating layer 3 and the conductive layer 7, seen from the top, have an approximately square shape with rounded edges. In order to house the button within the thickness of the card, the latter has a recess 13 running through only part of the thickness of the card and constituted by an external part 14 having a square shape for housing the insulating layer 3 and the conductive layer 7 of the button, and a narrower internal part 15 for housing the electronic circuit 9 and the casing 12 of the button.

The button 2 rests on a shoulder 16 of the card, joining the external 14 and internal 15 parts of the recess 13. A layer of adhesive 17 is placed between the shoulder 16 and the button 2.

As for the dimensions to be adopted, the following typical values are suggested, to be adapted as a function of the embodiments of FIGS. 2 through 11:

thickness of the conductive layer: 35 to 70 microns thickness of the insulating layer 3: 100 to 150 microns thickness of the electronic circuit 9: 135 to 225 microns total thickness of the button 2: 500 to 600 microns radius of curvature of the electrical connecting holes 4: typically greater than or equal to 400 microns width of the fragile zones: 100 to 500 microns, preferably 200 to 400 microns depth of the fragile zones: 50 to 250 microns, preferably around 200 microns radius of curvature in the corners of the fragile zones: preferably less than 50 microns length-to-width ratio of the fragile zones: from 10 to 60.

The values indicated above clearly show the difference between the electrical connecting holes 4 and the fragile zones 5, 6. The electrical connecting holes 4 are cylinders with a large radius of curvature; because of this shape, they are unlikely to break under stress and therefore cannot play the role of fragile zones. The fragile zones, on the other hand, are grooves, i.e., long, narrow recesses whose corners have a small radius of curvature; this shape is suitable for causing breaks in the fragile zones, in their corners and along them.

Furthermore, the materials used are advantageously the following:

conductive layer: copper insulating layer: epoxy glass or polyester. As for the casing, the material is chosen as a function of the embodiment. In the case where the casing is not capable of penetrating into the fragile zones (FIGS. 3, 4, 8, 11), it is possible to use a relatively rigid resin, namely epoxy resin. On the other hand, in the case where the casing is capable of penetrating into the fragile zones (FIGS. 6, 9), it is preferable to choose a more flexible material, for example silicone resin, in order not to cancel out the effect of fragility produced by the presence of the fragile zones.

In use, if a defrauder attempts to detach the button 2, for example in order to install it in an unauthentic card, by inserting a tool between the button 2 and the external part 14 of the recess 13, the insulating layer 3 will tend to fold along the fragile zones 5, 6. A first effect, observable to the eye, is a deformation of the contact region 7 of the conductive layer in an zone disposed facing the fragile zones; this deformation of the folding or blistering type can be detected by a checker performing a verification of the card. In the case where the defrauder further deforms the button, a second effect may be observed, consisting of a break in the insulating layer 3 and/or in the conductive layer along a line 18 passing through the fragile zones 5, 6.

According to the variant of FIG. 4, contact regions cover approximately the entire surface of the button 41. The fragile zones are disposed as a function of the contact regions and comprise, on one side of the button, a groove 42 running through a contact region 43 across nearly the entire width of the button 41, and on an opposite side of the button, three grooves 44 through 46, respectively disposed in three contact regions 47, 43, 48 and aligned between them. The fragile zones are still disposed on the outside of the casing 49. Preferably, as shown in this figure, the fragile zones do not extend beyond these contact regions.

In use, if a defrauder attempts to detach the button 41, the effects are similar to those in FIGS. 2 and 3.

Figure 5:
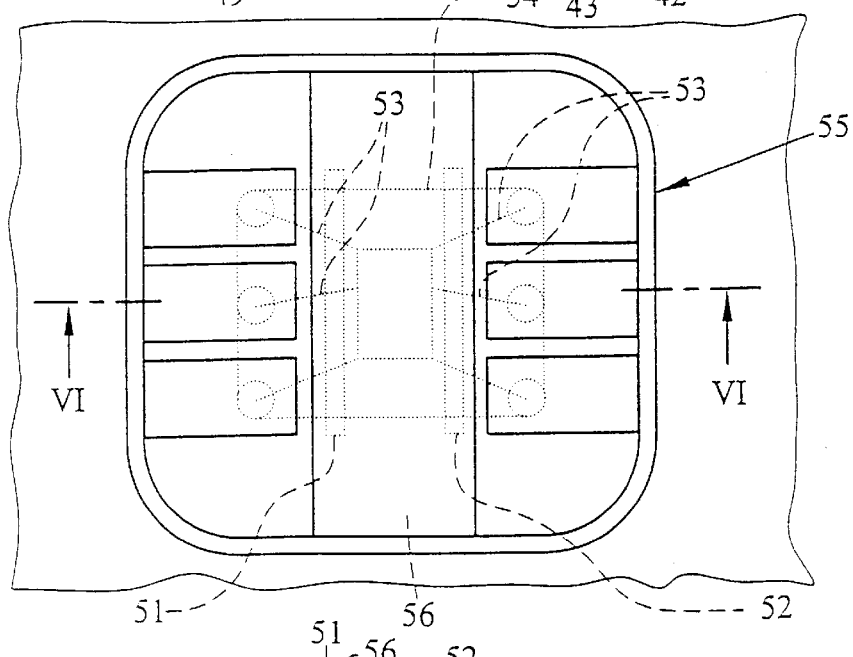
FIG. 5 is a top view of a button according to another variant of embodiment of the invention.
Figure 6:
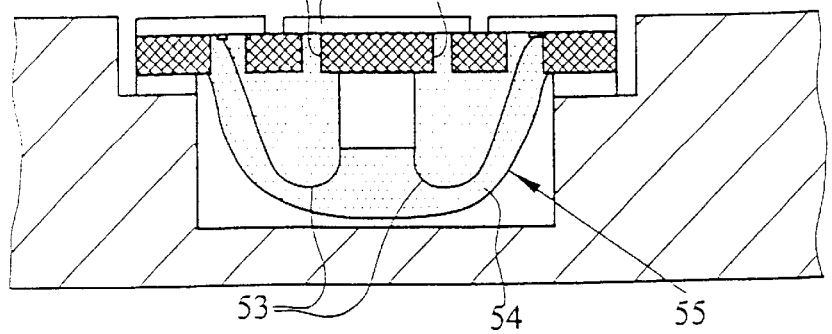
FIG. 6 is a cross-sectional view along the line VI—VI of FIG. 5.

According to the variant of FIGS. 5 and 6, the fragile zones 51, 52 comprise two grooves running through the insulating layer, facing the connecting wires 53 and approximately perpendicular to them. They run along a length that approximates the width of the casing 54. They still pass through the entire thickness of the insulating layer. Because of their position, the fragile zones are filled by the casing 54, which is not prejudicial to their function if, as indicated above, the casing is constituted by a sufficiently flexible material.

In use, if a defrauder attempts to detach the button 55, a first effect consists of the deformation, observable to the eye, of the contact region 56. A second effect consists of the stressing of the connecting wires 53, which are subjected to a stress that results in a break; in this case, the button is unusable.

Figure 7:
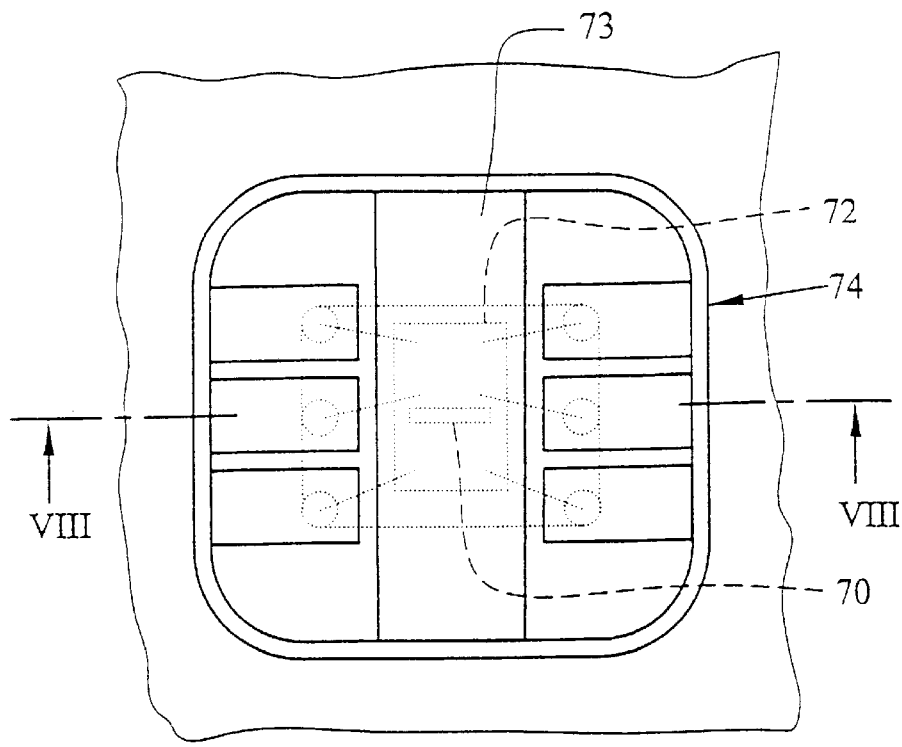
FIG. 7 is a top view of a button according to another variant of embodiment of the invention.
Figure 8:
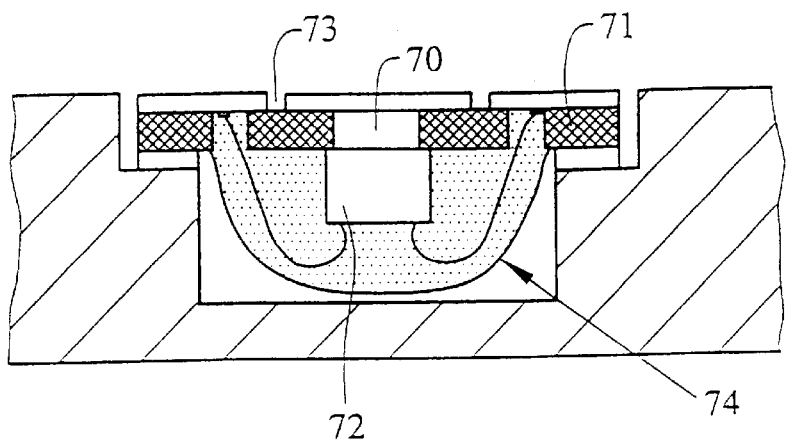
FIG. 8 is a cross-sectional view along the line VIII—VIII of FIG. 7.

In the example of FIGS. 7 and 8, only one fragile zone 70 is provided, which comprises a groove running through the entire thickness of the insulating layer 71, facing the electronic circuit 72. A central contact region 73 runs across the entire width of the button 74 and the fragile zone 70 runs perpendicular to the central contact region, along a length that approximates the width of the electronic circuit 72.

In use, if a defrauder attempts to detach the button 74, a first effect consists of the deformation, observable to the eye, of the contact region 73. A second effect consists of the stressing of the electronic circuit 72, which can result in a break in the latter along the fragile zone 70, rendering the button 74 unusable.

Figure 9:
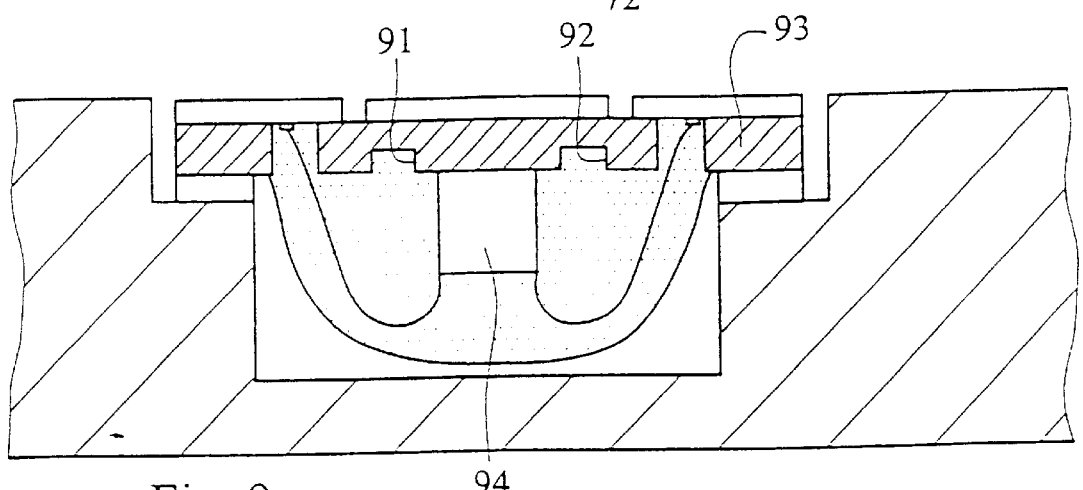
FIG. 9 is a cross-sectional view of a button according to another variant of embodiment of the invention.

In the example of FIG. 9, the fragile zones 91, 92 are not constituted by grooves passing through but by a reduction in the thickness of the insulating layer 93. These fragile zones are produced on an internal side of the insulating layer, facing the electronic circuit 94. In use, the effects of the presence of these fragile zones are similar to those described for FIGS. 5, 6.

Figure 10:
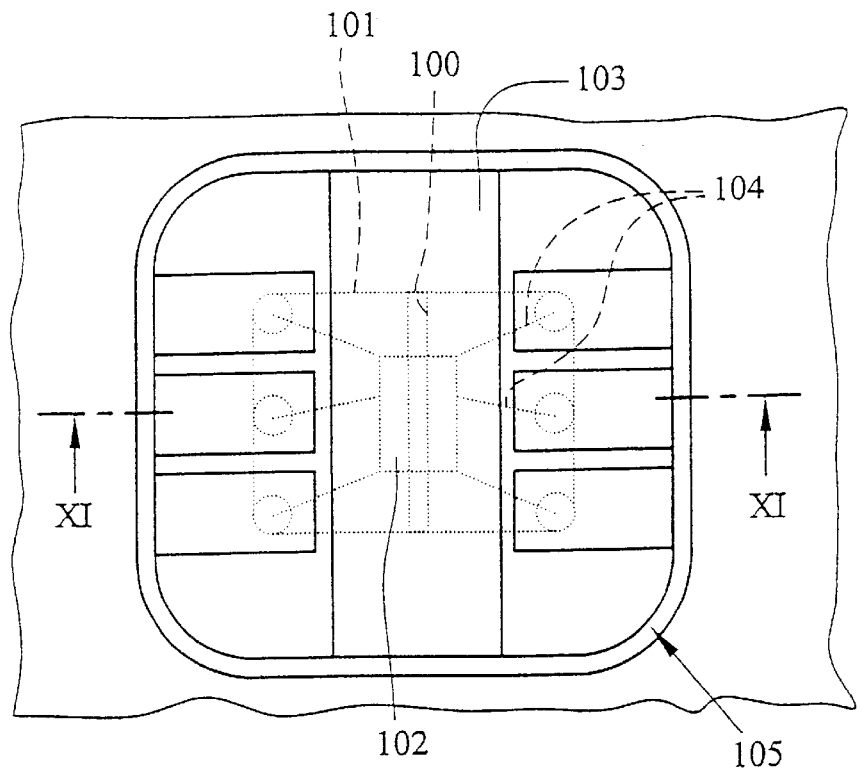
FIG. 10 is a top view of a button according to another variant of embodiment of the invention.
Figure 11:
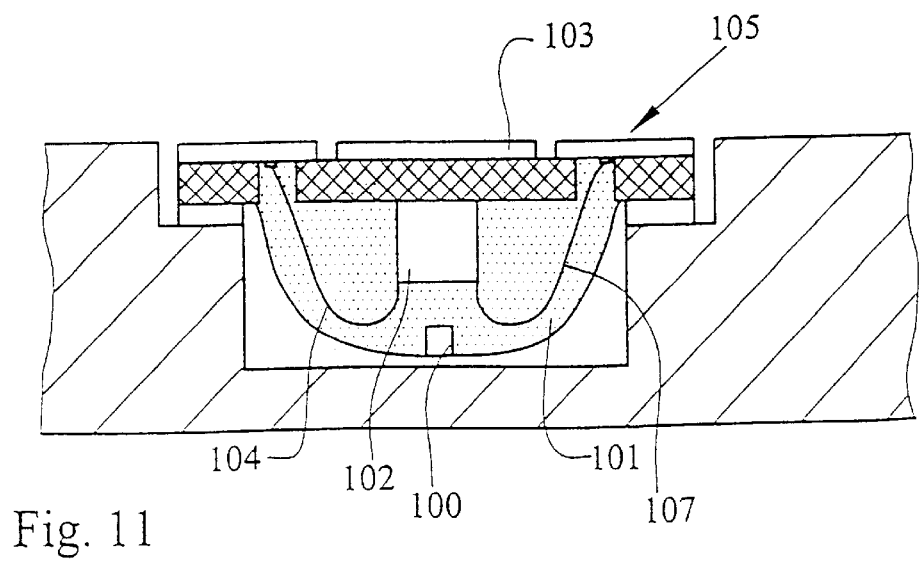
FIG. 11 is a cross-sectional view along the line XI—XI of FIG. 10.

In the example of FIGS. 10, 11, single fragile zone 100 is produced in the casing 101. This fragile zone is a groove produced on an external side of the casing, facing the electronic circuit 102, and running along a central contact region 103, approximately perpendicular to the connecting wires 104. The fragile zone 100 is produced, in particular, by etching by means of a laser beam or by mechanical machining. If necessary, a second fragile zone, similar to the first and perpendicular to it, can be provided.

In use, if a defrauder attempts to detach the button 105, the effect essentially consists of the stressing of the electronic circuit 102, which can result in the rupture of the latter along the fragile zone 100, making the button 105 unusable.

Based on the above, it is clear that the fragile zones could, depending on their location, either simply damage the button or make it unusable. When the fragile zones are not disposed in line with the electronic circuit or its connecting wires, but in proximity to the contact regions, the button is damaged; it may even be able to function. A defrauder might possibly be able to repair or replace the damaged contact regions, since they are on the outside of the button. On the other hand, when the fragile zones are disposed in line with the electronic circuit or its connecting wires, they cause them to break, which renders the button unusable; in this case, since the break is inside the button, it is practically irreparable.

Naturally, the invention is not limited to the manner in which the electronic circuit is connected to the contact regions. In the above examples, this connection is made by connecting wires. One variant, among others, consists of disposing a side of the electronic circuit carrying contact pads so that it faces the contact regions, and of performing a direct solder between the contact pads and the contact regions. More generally, the invention applies to any button carrying an electronic circuit and at least one contact region, no matter what the design and the external shape of the button, the fragile zones being provided inside an insulating volume in which the electronic circuit is housed.

The invention naturally applies not only to the chip card field, but also to any other field in which a similar electronic circuit substrate is used and is at risk of being removed by a defrauder.

While this inventioin has been described in conjunction with specific embodiments thereof, it is evident thatmany alternatives, modifications and variations will be apperent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. A substrate for an electronic circuit, the substrate comprising:
   an insulating element housing the electronic circuit and having a conductive layer on an external side, the conductive layer defining at least one contact region, the electronic circuit having at least one contact pad, said contact pad being connected to said contact region, and at least one fragile zone disposed in said insulating element, wherein the at least one fragile zone is designed so as to cause said insulating element to break along said fragile zone when a mechanical stress of a predetermined level is applied to said insulating element.

2. The substrate according to claim 1, wherein the fragile zone comprises a groove.

3. The substrate according to claim 1, wherein the fragile zone is disposed in proximity to the conducting layer.

4. The substrate according to claim 1, wherein the fragile zone is disposed in proximity to a main side of the electronic circuit.

5. The substrate according to claim 1, wherein at least one connecting wire connects the contact pad to the contact region, and wherein the fragile zone extends so as to be overlapped by said connecting wire.

6. The substrate according to claim 1, wherein the insulating element comprises an insulating layer to which the electronic circuit is attached, and further including a casing covering the electronic circuit, said fragile zone being disposed in the insulating layer.

7. The substrate according to claim 6, wherein the fragile zone comprises a hole passing through the insulating layer.

8. The substrate according to claim 6, wherein the fragile zone comprises a reduction in the thickness of the insulating layer.

9. A substrate for an electronic circuit, the substrate comprising:
   an insulating element housing the electronic circuit and having a conducting layer on an external side, the conducting layer defining at least one contact region, the electronic circuit having at least one contact pad, said contact pad being connected to said contact region, and at least one fragile zone disposed in said insulating element,
   wherein the insulating element comprises an insulating layer to which the electronic circuit is bonded, and a casing covering the electronic circuit, said fragile zone being disposed inside the casing.

10. The substrate according to claim 1, wherein said contact pad is connected to said contact region by an electrical connection, said electrical connection forming, with the electronic circuit, an electronic system, said fragile zone being disposed in line with said electronic system.

11. The substrate according to claim 10, wherein the fragile zone comprises a groove.

12. The substrate according to claim 10, wherein the fragile zone is disposed in proximity to the conductive layer.

13. The substrate according to claim 10, wherein the fragile zone is disposed in proximity to a main side of the electronic circuit.

14. The substrate according to claim 10, wherein at least one connecting wire connects the contact pad to the contact region, and wherein the fragile zone extends so as to be overlapped by said connecting wire.

15. The substrate according to claim 10, wherein the insulating element comprises an insulating layer to which the electronic circuit is attached, and further including a casing covering the electronic circuit, said fragile zone being disposed in the insulating layer.

16. An electronic device, comprising:
    an insulating layer; and
    an electronic circuit disposed on said insulating layer, said insulating layer including at least one hole which extends through said insulating layer at a location which, when a mechanical stress is applied to said insulating layer, causes said insulating layer to break along said hole.

17. An electronic device according to claim 16, wherein the location of said hole allows said electronic circuit to break when said mechanic stress is applied.

18. An electronic device according to claim 17, wherein the location of said hole is in alignment with said electronic circuit.

19. An electronic device according to claim 17, further comprising:
    a contact pad disposed on said insulating layer; and
    a wire connecting said electronic circuit with said contact pad, wherein the location of said hole is in alignment with said wire.

20. An electronic device according to claim 16, wherein the location of said hole does not overlap said electronic circuit, such that when said mechanical stress is applied said electronic circuit remains electrically operable.

21. An electronic device according to claim 16, wherein said hole is in a shape of a groove.

22. An electronic device according to claim 21, wherein said groove extends substantially an entire length of said electronic circuit.

23. An electronic device according to claim 20, further comprising:
    a second hole in said insulating layer, wherein said hole and said second hole are located on opposite sides relative to said electronic circuit.

24. An electronic device, comprising:
    an insulating layer;
    an electronic circuit disposed on said insulating layer; and
    a casing enclosing said electronic circuit, said casing including a fragile zone which causes at least said casing to break when a mechanical stress is applied to said insulating layer.

25. An electronic device according to claim 24, wherein said fragile zone includes a groove having a depth which does not extend through said casing.

26. An electronic device according to claim 24, wherein said fragile zone is aligned with said electronic circuit.

27. An electronic circuit according to claim 24, further comprising:

a contact pad on said insulating layer; and a wire connecting said contact pad and said electronic circuit, wherein said fragile zone is aligned with said wire.

28. A smart card, comprising:

a card substrate; and an electronic device on said card substrate, said electronic device including:
- (a) an insulating layer; and
- (b) an electronic circuit disposed on said insulating layer, said insulating layer including at least one hole which extends through said insulating layer at a location which, when a mechanical stress is applied to said substrate, causes said insulating layer to break along said hole.

29. A smart card according to claim 28, wherein said card substrate includes a first aperture in alignment with a second aperture, said first aperture being wider than said second aperture, wherein said insulating layer is wider than said electronic circuit, and wherein said insulating layer is at least partially supported by a shoulder portion located between said first aperture and said second aperture and said electronic circuit extends into said second aperture.

30. A smart card according to claim 28, wherein the location of said hole allows said electronic circuit to break when said mechanical stress is applied.

31. A smart card according to claim 30, wherein the location of said hole is in alignment with said, electronic circuit.

32. A smart card according to claim 28, wherein the location of said hole does not overlap said electronic circuit, such that when said mechanical stress is applied said electronic circuit remains electrically operable.

* * * * *